United States Patent
Saeki et al.

(10) Patent No.: US 7,912,169 B2
(45) Date of Patent: Mar. 22, 2011

(54) SYNCHRONIZATION DEVICE AND SEMICONDUCTOR DEVICE

(75) Inventors: Takanori Saeki, Kanagawa (JP); Minoru Nishizawa, Kanagawa (JP); Masashi Nakagawa, Kanagawa (JP); Hisakazu Nasu, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 1045 days.

(21) Appl. No.: 11/218,528

(22) Filed: Sep. 6, 2005

(65) Prior Publication Data

US 2006/0050827 A1 Mar. 9, 2006

(30) Foreign Application Priority Data

Sep. 7, 2004 (JP) ................................ 2004-260201

(51) Int. Cl.
*H04L 7/04* (2006.01)
(52) U.S. Cl. ........ 375/362; 375/354; 375/355; 375/374; 375/376
(58) Field of Classification Search .................. 375/362, 375/354, 355, 375, 376
See application file for complete search history.

(56) References Cited

U.S. PATENT DOCUMENTS

| | | | |
|---|---|---|---|
| 6,092,211 A * | 7/2000 | Hozumi | 713/500 |
| 6,259,293 B1 | 7/2001 | Hayase et al. | |
| 6,724,328 B1 | 4/2004 | Lui et al. | |
| 6,750,675 B2 | 6/2004 | Venkata et al. | |
| 6,946,886 B2 | 9/2005 | Isomura | |
| 7,046,174 B1 * | 5/2006 | Lui et al. | 341/101 |
| 7,272,677 B1 * | 9/2007 | Venkata et al. | 710/71 |
| 7,366,267 B1 * | 4/2008 | Lee et al. | 375/354 |
| 2003/0214335 A1 | 11/2003 | Saeki | |
| 2004/0051571 A1 | 3/2004 | Okamura | |
| 2004/0136402 A1 | 7/2004 | Ozawa | |
| 2006/0012394 A1 * | 1/2006 | Venkata et al. | 326/41 |

FOREIGN PATENT DOCUMENTS

EP 1 028 531 8/2000

(Continued)

OTHER PUBLICATIONS

German Office Action dated May 11, 2007 with partial English Translation.

(Continued)

*Primary Examiner* — Shuwang Liu
*Assistant Examiner* — Dhaval Patel
(74) *Attorney, Agent, or Firm* — McGinn IP Law Group, PLLC

(57) ABSTRACT

An apparatus for performing a channel-to-channel delay correction and frame synchronization with low latency includes, on each of a plurality of channels, a clock-and-data recovery circuit, a frequency divider circuit, a circuit for detecting the phase difference between the phase of the frequency-divided clock signal and the phase of a clock signal, a serial-to-parallel converter circuit, a register array for holding the parallel output of the serial-to-parallel converter circuit, and a frame-head detector for detecting a frame head from the output of the register array and outputting a frame detection signal. A last-frame-head detector receives the frame detection signals from each of the channels and detects a channel on which the frame head was detected last. The frame head detected last, the phase of the internal clock signal, and the phase of a frequency-divided clock of a retiming clock of the channel are adjusted to substantially coincide.

20 Claims, 11 Drawing Sheets

FOREIGN PATENT DOCUMENTS

| | | |
|---|---|---|
| EP | 1 248 372 | 10/2002 |
| JP | 5-30067 | 2/1993 |
| JP | 5-030067 | 2/1993 |
| JP | 5-103031 | 4/1993 |
| JP | 11-187002 | 7/1999 |
| JP | 2002-190724 | 7/2002 |
| JP | 2003-273852 | 9/2003 |
| JP | 2003-333021 | 11/2003 |
| TW | 483254 | 4/2002 |
| TW | 529280 | 4/2003 |
| TW | 548902 | 8/2003 |
| TW | 550920 | 9/2003 |

OTHER PUBLICATIONS

Taiwanese Office Action dated Jan. 22, 2009 with Partial Translation.

* cited by examiner

SYNCHRONIZATION DEVICE AND SEMICONDUCTOR DEVICE

FIELD OF THE INVENTION

This invention relates to a synchronizing circuit and, more particularly, to a synchronizing circuit and semiconductor device for adjusting delay (skew) between channels and performing byte/word alignment or frame synchronization in a multi-channel high-speed interface.

BACKGROUND OF THE INVENTION

The operating frequencies of semiconductor integrated circuits have become quite high in recent years. For example, an LSI device for a high-speed interface capable of implementing a high-speed serial transfer in the gigabit band includes a serial-to-parallel converter (also referred to as a "DESerializer") for converting data input serially to parallel data, and a parallel-to-serial converter (also referred to as a "SERializer") for converting parallel data to serial data. An increase in the degree of integration of semiconductor integrated circuits and the use of multiple channels achieved by high-density packaging have been accompanied by the need for an arrangement in which data on a plurality of channels is received in a short time synchronously between channels. In such an interface, a frame pattern is inserted periodically at prescribed positions in data transmitted serially from the transmitting side, and the frame pattern is detected on the receiving side to assure frame synchronization. It is assumed here that the frame pattern is, e.g., a header byte code (a "comma code") for byte alignment [see the specification of Japanese Patent Kokai Publication No. JP-A-11-187002 (Patent Reference 1)] and that the timing of byte or word alignment is adjusted appropriately by detection of the comma code.

An arrangement of the kind shown in FIG. 10, for example, is known as an interchannel synchronization device in a terminal that sends and receives data using a plurality of channels [see the specification of Japanese Patent Kokai Publication No. JP-A-5-103031 (Patent Reference 2)]. When one of synchronizing signal detectors 208 to 213 detects a synchronizing signal in this device, a synchronization monitoring unit 214 outputs a timing-signal generation command signal to a first timing signal generator 216, causing the latter to generate a synchronization timing signal, and outputs a changeover command signal to a timing signal changeover unit 218 so that the synchronization timing signal that has been generated will be supplied to the synchronizing signal detector that detected the synchronizing signal. When another synchronizing signal detector detects a synchronizing signal next, a second timing signal generator 217 similarly supplies a synchronization timing signal to this synchronizing signal detector. When synchronization is established on each of these two channels, a delay calculating unit 215 calculates the amount of delay between these two channels and a delay-difference accommodating unit 270 eliminates the difference in delay between the two channels based upon the result of calculation. Whenever a synchronizing signal detector detects a synchronizing signal, a similar operation is repeated until differences in delay among all of the channels are eventually eliminated and all channels are synchronized.

The detecting of channel-to-channel delay and the elimination of this delay in such an arrangement are carried out one after the other in terms of time every two channels in which synchronizing signals are detected. If there are multiple channels, an increase in number of combinations $_NC_2$ is attended by the need for a longer period of time to establish synchronization among all channels. This arrangement cannot be applied to a multichannel high-speed interface.

An arrangement having a channel-phase discriminating circuit is known in the art [see the specification of Japanese Patent Kokai Publication No. JP-A-5-30067 (Patent Reference 3)]. A low-speed synchronizing unit having a frame pattern detecting circuit, a frame synchronization/protection circuit and a control circuit for controlling the latter is provided in a number equivalent to the number of receive channels. The discriminating circuit determines whether a frame-pattern detection position detected by each low-speed synchronizing unit or a specific position of a frame has been lost or has occurred owing to a false frame or malfunction of the low-speed synchronizing unit, and estimates the misalignment of channel phase. In FIG. 11, a bit serial-to-parallel converter 1001 corrects the channel phase in a byte serial-to-parallel converter 1002 based upon a channel-shift command from a channel-phase discriminating circuit (which receives frame-position designating signals from low-speed synchronizing units) 1009. Further, when frame synchronization is lost, a bit-shift command is supplied to the bit serial-to-parallel converter 1001 and bit misalignment is corrected. The channel-phase discriminating circuit 1009 discriminates the misalignment of channel phase and the bit serial-to-parallel converter 1001 corrects the misalignment of channel phase. Low-speed synchronizing units 1003, 1004, 1005 and 1006 each have a frame-synchronization detection/protection circuit 1010, a frame pattern detecting circuit 1011 and a control circuit 1012, etc. When frame synchronization is lost, the low-speed synchronizing units 1003, 1004, 1005 and 1006 output bit-shift commands 1040, 1042, 1044 and 1046, respectively.

In the case of the arrangement shown in FIG. 11, the plurality of channels are all compared without performing clock correction on the side of the low-speed synchronizing units 1003, 1004, 1005 and 1006. Control for correcting a delay between channels is complicated. Further, it becomes necessary to correct delay in the interconnection routed to data delay comparison.

In the arrangement shown in FIG. 11, correction of delay is performed after the serial-to-parallel conversion. In a case where the correction of delay is performed before the serial-to-parallel conversion, it is necessary to perform the delay correction before the arrival of the succeeding data in order to achieve implementation of low latency. A pipeline configuration is adopted, etc., and problems arise in terms of high-speed timing design and an increase in power.

[Patent Reference 1]
  Japanese Patent Kokai Publication No. JP-A-11-187002
[Patent Reference 2]
  Japanese Patent Kokai Publication No. JP-A-5-103031
[Patent Reference 3]
  Japanese Patent Kokai Publication No. JP-A-5-30067
[Patent Reference 4]
  Japanese Patent Kokai Publication No. JP-P2002-190724A
[Patent Reference 5]
  Japanese Patent Kokai Publication No. JP-P2003-333021A An architecture that is sought in multichannel high-speed interfaces is one that corrects delay (skew) between channels, achieves word synchronization (or frame synchronization) and reduces latency (amount of delay).

The technique described in Patent Reference 2, namely performing synchronization two channels at a time, is such that establishing synchronization on all channels takes time.

In terms of latency, therefore, it is difficult to apply this technique to a multichannel high-speed interface.

On the other hand, the technique described in Patent Reference 3 is such that control for correcting delay between channels is complicated and is difficult to apply to a high-speed interface.

SUMMARY OF THE DISCLOSURE

According to one aspect of the present invention, there is provided a synchronization device having a receiver circuit in each of a plurality of channels, the receiver circuits inputting received serial data on a plurality of channels, subjecting the received serial data on respective ones of the channels to a serial-to-parallel conversion and outputting parallel data, each receiver circuit in the plurality of channels having a circuit for bringing the phase of a clock signal used at least in the serial-to-parallel conversion into conformity with the phase of an internal clock supplied to the receiver circuit and adjusted for skew at a clock input terminal of the receiver circuit in each of the plurality of channels, thereby assuring synchronization among the plurality of channels.

According to another aspect of the present invention, there is provided a synchronization device having a receiver circuit in each of a plurality of channels, each of the receiver circuits having a clock-and-data recovery circuit for generating a data signal and a recovery clock signal from received serial data, and a serial-to-parallel converter circuit for subjecting the data signal, which has been output from the clock-and-data recovery circuit, to a serial-to-parallel conversion based upon a frequency-divided clock signal obtained by frequency-dividing the recovery clock signal, the receiver circuit detecting a frame pattern that has been inserted into the received serial data and outputting a parallel data signal synchronized to the frame pattern; each receiver circuit in the plurality of channels having a circuit for bringing the phase of the frequency-divided clock signal used at least in the serial-to-parallel conversion into conformity with the phase of an internal clock supplied to the receiver circuit and adjusted for skew at a clock input terminal of the receiver circuit in each of the plurality of channels, thereby assuring synchronization among the plurality of channels.

The device may further comprise a circuit for performing control for bringing the timing phase of the frequency-divided clock signal in the receiver circuit of each channel into conformity with the timing phase of the internal clock signal at a detection timing of a frame pattern on a channel on which a frame pattern was detected last; wherein the receiver circuit of each channel has a register array for holding the parallel data signal, which has been obtained by the conversion in the serial-to-parallel converter circuit, until a frame pattern is finally detected; and byte- or word-aligned parallel data signals are output in unison from the receiver circuits on the plurality of channels in synchronization with the timing at which the frame pattern was detected on the channel on which the frame pattern was detected last.

According to another aspect of the present invention, there is provided a synchronization device for receiving data on a plurality of channels and performing channel-to-channel synchronization and frame synchronization, comprising the following in each of the plurality of channels: a clock and data recovery circuit, which receives multiphase clock signals generated from a clock signal that is output from a clock source within the device and a received data signal of the channel, for generating a data signal and a recovery clock signal; a first frequency divider circuit, which receives the recovery clock signal as an input, for generating a frequency-divided clock signal from this clock signal; a phase detection control circuit for detecting a phase difference between the phase of the frequency-divided clock signal from the first frequency divider circuit and the phase of an internal clock signal supplied within the device and adjusted for skew, the clock signal being obtained by frequency dividing the clock signal from the clock source, and exercising control in such a manner that the phase of the frequency-divided clock signal and the phase of the internal clock signal will substantially coincide; a serial-to-parallel converter circuit, which receives the frequency-divided clock signal from the first frequency dividing circuit, for converting the data signal, which is output from the clock and data recovery circuit, to parallel data; a register array for holding the parallel data, which is output from the serial-to-parallel converter circuit, for a prescribed number of stages; and a frame detecting circuit for detecting a frame pattern from output signals of the serial-to-parallel converter circuit and register array, and outputting a frame detection signal; and the following shared by the plurality of channels: a detecting circuit, which receives the frame detection signal from the frame detecting circuit of each channel, for detecting, from among the plurality of channels, a channel on which a frame pattern was detected last; and a timing control circuit for exercising control in such a manner that timing of a frame head of the channel on which the frame pattern was detected last, the phase of the internal clock signal and the phase of the frequency-divided clock signal in the receiver circuit of the channel are shifted and adjusted so as to substantially coincide; wherein until the frame pattern is output in parallel from the serial-to-parallel converter circuit on the channel in which the frame pattern was detected last, parallel data signals that have been output from the serial-to-parallel converter circuits of the other channels are held in the register arrays of these other channels; and in the receiver circuits of each of the channels, byte- or word-aligned parallel data signals are output in unison in synchronization with detection timing of a frame pattern on a channel on which the frame pattern was detected last.

Preferably, the device further comprises a second frequency divider circuit for frequency dividing the clock signal from the clock source within the device, wherein the internal clock signal supplied to the receiver circuit of each channel comprises a CTS (Clock Tree Synthesis) clock signal adjusted for skew between clocks via CTS buffers, which are mounted on the same chip as the receiver circuit, for propagating the frequency-divided clock from the second frequency divider circuit.

Preferably, the device according to the present invention exercises control to bring the timing phase of the frequency-divided clock signal of the first frequency divider circuit of the channel on which the frame pattern was detected last into conformity with the detection timing of the frame pattern on the channel in which the frame pattern was detected last, and to bring the timing phases of the frequency-divided clocks of the first frequency-divider circuits on the other channels and the timing phase of the internal clock signal into conformity with the detection timing of the frame pattern on the channel on which the frame pattern was detected last.

Preferably, the first frequency divider circuit in the device of the present invention comprises a counter which receives the recovery clock signal as an input clock, wherein the counter is so adapted that a counting period of the counter is set variably temporarily under control from the timing control circuit in such a manner that a byte- or word-aligned parallel data signal will be output from the serial-to-parallel converter circuit in synchronization with the detection timing of the frame pattern on the channel on which the frame pattern was detected last.

Preferably, the second frequency divider circuit in the device of the present invention comprises a counter, wherein the counter is so adapted that a counting period of the counter is set variably temporarily under control from the timing control circuit in such a manner that a byte- or word-aligned parallel data signal will be output from the serial-to-parallel converter circuit in synchronization with the detection timing of the frame pattern on the channel on which the frame pattern was detected last.

In the device according to the present invention, the first frequency divider circuit generates multiphase frequency-divided clock signals of phases that are spaced apart from one another, wherein the device further comprises an edge detecting circuit, which receives the CTS clock signal and multiphase frequency-divided clock signals, for detecting a transition edge of the CTS clock signal using the multiphase frequency-divided clock signals; the phase of the frequency-divided clock signal used in the serial-to-parallel conversion being adjusted in such a manner that this phase will best coincide with the phase of the CTS clock signal.

The device according to the present invention may further comprise a selector for outputting a byte- or word-aligned parallel data signal in synchronization with the detection timing of the frame pattern on the channel on which the frame pattern was detected last; the parallel data signal being output from the parallel-serial converting circuit on the channel on which the frame pattern was detected last, and being output from the register array on channels other than the channel on which the frame pattern was detected last.

The device according to the present invention may further comprise transmitter circuits on a plurality of channels, each transmitter circuit having a parallel-serial converting circuit for converting parallel data to transmit serial data using the frequency-divided clock signal whose phase has been adjusted to the phase of the internal clock signal; an output signal from the parallel-serial converting circuit being output to a serial transmission line.

The meritorious effects of the present invention are summarized as follows.

In accordance with the present invention, delay compensation between channels and frame synchronization can be achieved with low latency in a multichannel high-speed interface, and it is possible to reduce power consumption and area. The reasons are as follows: According to the present invention, the timing of a frequency-divided clock signal for a serial-to-parallel conversion on each channel is made to conform to a CTS clock signal the timing of which has been adjusted inside the device, thereby adjusting the delay between channels. Furthermore, according to the invention, the timing of the CTS signal and the timing of the frequency-divided clock signal for the serial-to-parallel conversion are adjusted using, as a reference, detection timing of the last frame head on a channel, among the plurality of channels, on which the frame head was detected last. As a result, delays among all channels and frame synchronization among all channels can be adjusted without using complicated control and a complicated structure.

Further, in accordance with the present invention, it is unnecessary to use a special structure for the serial-to-parallel converter circuit, etc. The parallel data on a preceding channel is accumulated in a register array by the time the frame pattern is detected on the channel on which the frame pattern is detected last. At the moment the frame head is detected on the last channel, frame-synchronized parallel data is output from each of the channels in unison. A high-speed FIFO (First In First Out) arrangement also is unnecessary and increase in power consumption and circuit area is suppressed while low latency is achieved.

Other features and advantages of the present invention will be apparent from the following description taken in conjunction with the accompanying drawings, in which like reference characters designate the same or similar parts throughout the figures thereof.

PREFERRED EMBODIMENTS OF THE INVENTION

Figure 1:
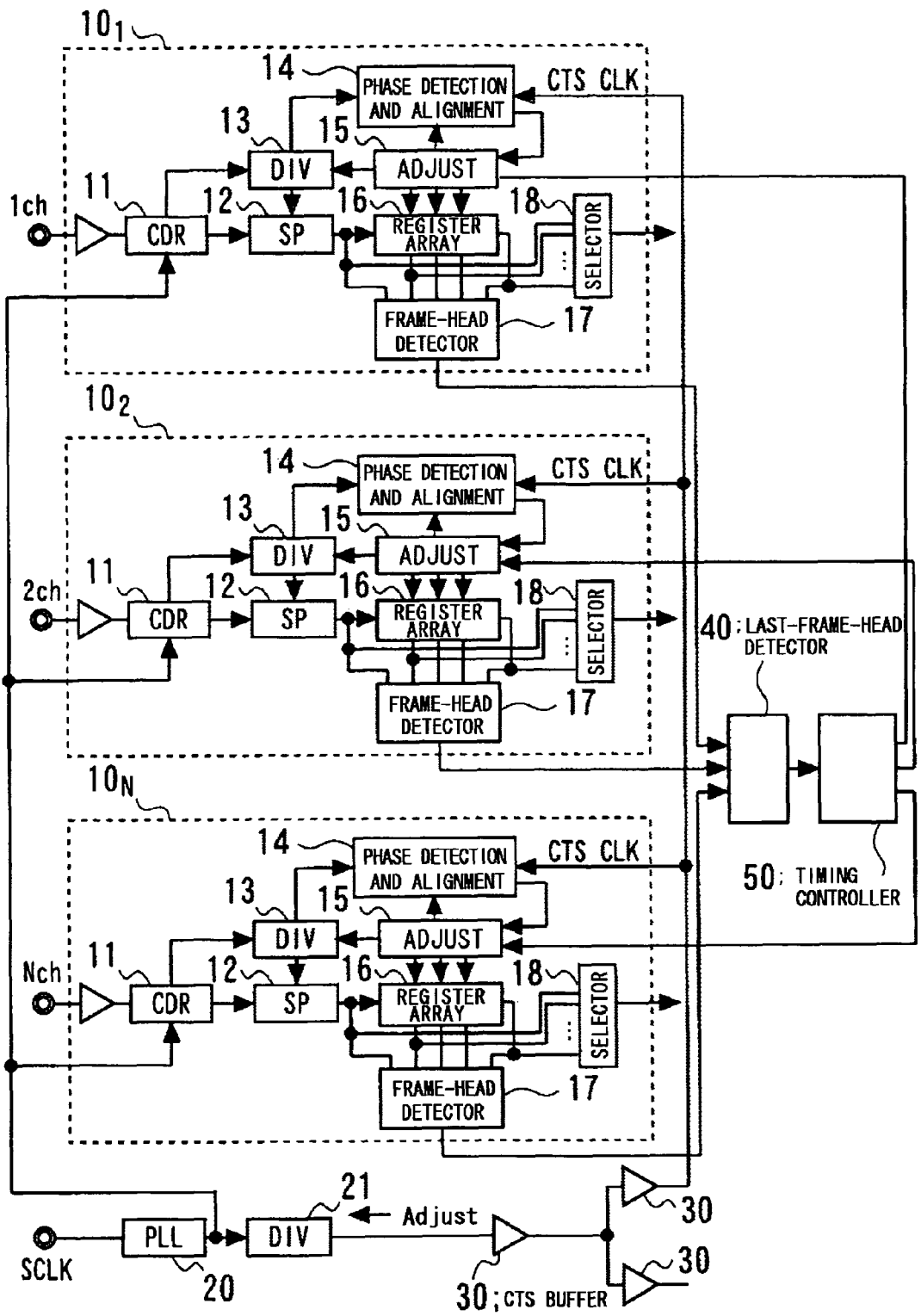
FIG. 1 is a diagram illustrating an example of the overall structure of a mode of practicing the present invention.

A mode of practicing the present invention will now be described with reference to the drawings. A synchronization device according to this mode of practicing the invention preferably is mounted on a semiconductor integrated circuit device and has a receiver circuit for receiving serial data on multiple channels (N channels) from a transmission line, subjecting the serial data to a serial-to-parallel conversion and outputting the parallel data. FIG. 1 is a diagram illustrating the main components of this mode of practicing the present invention. Referring to FIG. 1, a PLL (Phase-Locked Loop) circuit 20 is a clock generating circuit, which receives a system clock SCLK, for generating a clock that is internal to the device. The output of the PLL circuit 20 is frequency-divided by a frequency divider circuit 21 and the resultant signal is distributed within the semiconductor integrated circuit device via a CTS (Clock Tree Synthesis) buffer 30. The clock signal ("CTS clock signal") from the CTS buffer 30 is distributed to the clock destinations as a core clock signal within the semiconductor integrated circuit device. Clock tree synthesis is used in applications in which a clock is supplied through a buffer tree, which is automatically synthesized by a layout, so that clock skew in a large fan-out, for example, is minimized. In other words, the set-up is such that skew of the CTS clock signal supplied to receiver circuits $10_1$ to $10_N$ from the clock source (PLL 20 and frequency divider circuit 21) is minimized.

The output of the PLL circuit 20 is supplied to a clock and data recovery circuit 11 on each of a plurality of channels (1ch to Nch).

A frequency divider circuit 13 frequency-divides a recovery clock signal, which is synchronized to received data, that is output from the clock and data recovery circuit 11.

Using the frequency-divided clock signal from the frequency divider circuit 13, a serial-to-parallel converter circuit 12 applies a serial-to-parallel conversion to a data signal (serial data) that is output from the clock and data recovery circuit 11. In a case where the serial-to-parallel converter circuit 12 performs a 1:8 parallel conversion (i.e., converts 1-bit serial data to 8-bit parallel data), the parallel conversion is performed using a clock signal the frequency of which is obtained by dividing the frequency of the recovery signal by 8. Further, in a case where the serial-to-parallel converter circuit 12 performs a conversion to parallel data of a total of 12 bits by 2:12 conversion (1:6 for even bits and 1:6 for odd bits), each parallel conversion is performed using a clock signal the frequency of which is obtained by dividing the frequency of the recovery signal by 6, by way of example.

Based upon the frequency-divided clock signals (frequency-divided multiphase clock signals) output from the frequency divider circuit 13, a phase detection and alignment circuit 14 detects the timing of the transition of the CTS clock signal that is supplied to the receiver circuit 10 and, based upon the sensed transition timing, applies an adjustment to minimize the phase difference between the frequency-divided clock signal, which is the result of dividing the frequency of the recovery clock signal by 6, and the CTS clock signal input thereto. For example, phase is adjusted in such a manner that the phase difference falls within ±1 UI (Unit Interval).

In the phase detection and alignment circuit 14 on each channel, each CTS clock signal supplied is passed through the CTS buffer 30, which has been placed in the device automatically, as a result of which adjustment of skew between CTS clock signals is completed when the semiconductor integrated circuit device is designed. By performing an adjustment on each channel in such a manner that the phase of the frequency-divided clock signal on each channel will coincide with the phase of the CTS clock signal that has been adjusted for skew, the timing phases of the frequency-divided clock signals between channels are adjusted so as to agree. As a result, delay (skew) between channels is adjusted. That is, the N-number of CTS clock signals supplied to the phase detection and alignment circuits 14 of the N-number of receiver circuits 10₁ to 10_N undergo skew minimization when the semiconductor integrated circuit device is designed, and the CTS clock signals thus adjusted for skew are used as reference clocks for channel-to-channel synchronization. This arrangement is one characterizing feature of the present invention.

The parallel data that is output from the serial-to-parallel converter circuit 12 using the frequency-divided clock signal phase-adjusted to the CTS clock signal is transferred sequentially to a register array 16. The latter comprises a group of registers for sampling and outputting data, which is output in parallel from the serial-to-parallel converter circuit 12 or from a register of the preceding stage, using the input frequency-divided clock signal (the phase of which has been adjusted to agree with the phase of the CTS clock signal) as a sampling clock.

A frame-head detector 17 outputs a frame-head detection signal when it detects a frame pattern in the signal that is supplied to the register array 16 from the serial-to-parallel converter circuit 12. It should be noted that the frame pattern may be the above-mentioned comma code for byte or word alignment used in a high-speed interface. That is, the arrangement is such that byte- or word-aligned parallel data is output in synchronization with the timing of the frame head.

It should be noted that the beginning of the parallel signal that is supplied to the register array 16 from the serial-to-parallel converter circuit 12 will not necessarily agree with the leading bit of the frame head (the frame pattern at the head of the frame). Consequently, there are cases where the frame-head detector 17 detects the frame head from plural bit signals extending over a plurality of bytes (words) (i.e., cases where pattern matching that extends over the signals that have been stored in the register array 16 is performed). Alternatively, the frame pattern may have a plurality of word lengths, as a matter of course. The frame-head detector 17 outputs the frame-detection signal when it detects the frame pattern.

A last-frame-head detector 40 is provided and shared by the receiver circuits 10₁ to 10_N of all channels. The last-frame-head detector 40 detects the channel on which the frame detection signal is detected last among the receiver circuits 10₁ to 10_N of all channels. If the last-frame-head detector 40 has received a frame detection signal from the frame-head detector 17 of each channel, the detector stores the signals in a register (not shown) in the order in which they were received, for example, and detects the channel on which the frame detection signal is detected last.

A timing controller 50 is provided and shared by the receiver circuits 10₁ to 10_N of all channels. The timing controller 50 accepts detection information from the last-frame-head detector 40 and, on the basis of the detection timing of the last frame head among the N-number of channels and the detection timings of the frame heads on the other channels, finds the time difference between the detection timing of the frame head on each channel and the detection timing of the last frame head. The timing of the CTS clock signal and the timing of the frequency-divided clock signal on each channel are adjusted in such a manner that the parallel-output timing of the frame head on the channel on which the frame was detected last and the parallel-output timing of the preceding frame head on each channel with coincide. As a result, a timing adjustment for frame synchronization is performed.

In the present embodiment, the timing controller 50 transmits timing adjustment information to each channel. On the basis of the timing adjustment information, an adjust-signal generating circuit 15 instructs the frequency divider circuit 13 to adjust the timing of the frequency-divided clock signal. Further, the adjust-signal generating circuit 15 sends the timing adjustment information to the phase detection and alignment circuit 14 that supplies the frequency-divided clock to the register array 16. At this time, with regard to the channel on which the frame head was detected last, it is preferred that adjustment of the clock period of the frequency-divided clock be applied to the frequency divider circuit 13 on the channel on which the frame head was detected last, in such a manner that the parallel data signal that is output in parallel from the serial-to-parallel converter circuit 12 will be output in the frame-synchronized state and delivered via a selector 18 as is.

More specifically, the number of clock counts (counter period) in the frequency divider circuit 13 is varied in terms of time in such a manner that the byte or word data that is output in parallel from the serial-to-parallel converter circuit 12 will coincide with the detection timing of the frame head. For example, if the number of counts is reduced a prescribed number of cycles (x cycles) for one period in the frequency divider circuit 13, phase can be shifted forward by x cycles. Similarly, the number of counts is reduced by x cycles in the frequency divider circuits 13 on the other channels. Furthermore, in the frequency divider circuit 21 that outputs the CTS clock signal, the count clock of six for frequency division by six is reduced by x cycles to shift the phase forward by six clock cycles.

The above-described timing adjustment usually is performed by the receiver circuit when a signal for adjustment is received.

The parallel data of the other preceding channels is held in the register array 16 of respective ones of the channels until the last frame head (frame pattern) is output in the byte- or word-aligned state from the serial-to-parallel converter circuit 12 in the state in which the above-described timing adjustment has been carried out. When the last frame head (frame pattern) has been output in the byte- or word-aligned state from the serial-to-parallel converter circuit 12, frame-synchronized signals (byte- or word-aligned parallel data) are output in unison from prescribed positions of the register array 16 of each of the channels via the selector 18 in synchronization with the output of the last frame head. In other words, the selector 18 of the channel on which the frame head was detected last selects and delivers the output from the serial-to-parallel converter circuit 12 as is. The selector 18 of the other preceding channels operate as follows: Data corresponding to the time difference (equivalent to the clock count) calculated by the timing controller 50 is accumulated in the register array 16 by the time the frame head is detected on the channel on which the frame head is detected last. One byte or one word of the data is output in parallel via the selector 18 from the beginning of the data stored in the register array 16 in the amount of the time difference.

By virtue of this arrangement, frame synchronization and adjustment of delay between channels of frame-synchronized signals are realized on each of the channels. Furthermore, delay is regarded apparently as propagation delay time of the selector 18 and a reduction in latency is achieved.

Consider as an example for comparison an arrangement in which a recovery clock signal is generated from a serially transmitted data signal on each channel and byte or word alignment is performed in parallel data based upon the frequency-divided clock obtained by frequency dividing the recovery clock signal. If use is made of a FIFO (in which a recovery clock signal serves as a write clock signal and a PLL clock signal serves as a read clock signal) in a case where the recovery clock signal is placed in a PLL clock signal in the device in this arrangement, a problem which arises is a delay in a counter that generates the read address and write address of the FIFO. For example, in the case of a 1:12 serial-to-parallel converter circuit (even bit data undergoes a serial-to-parallel conversion at 1:6 and odd bit data undergoes a serial-to-parallel conversion at 1:6), FIFO latency generally becomes two to three times the frequency-divided clock (a clock obtained by frequency division by 6). If one cycle of the recovery clock signal is 2 UI, then FIFO latency will be 24 to 36 UI. Further, in a case where a FIFO is placed in front of the serial-to-parallel converter circuit, a FIFO of still higher speed will be necessary as well as a higher speed for the clock that drives this high-speed FIFO. This is not realistic.

The present invention will now be described in accordance with a preferred embodiment.

Embodiment 1

Figure 2:
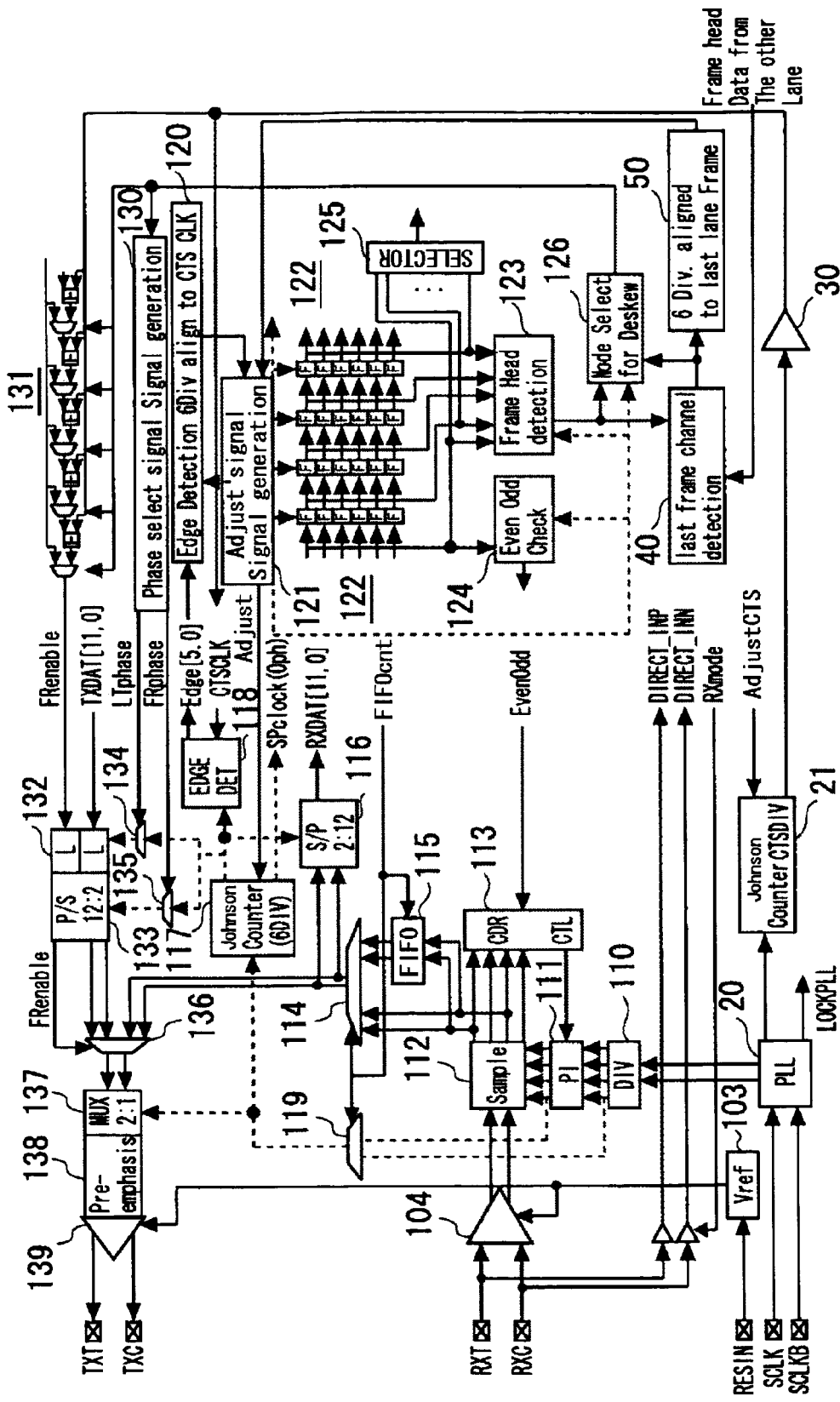
FIG. 2 is a diagram illustrating the structure of an embodiment of the present invention.

FIG. 2 is a diagram illustrating the structure of a preferred embodiment of the present invention. To facilitate preparation of the drawings, FIG. 2 illustrates a transceiver circuit on one channel only and circuitry that is shared by all channels.

As shown in FIG. 2, the PLL circuit 20 outputs a clock signal the phase of which has been synchronized to the phase of the system clock SCLK.

The output clock signal of the PLL circuit 20 is supplied to the frequency divider circuit 21, which outputs a frequency-divided clock signal (CTS CLK). The frequency divider circuit 21 comprises a scale-of-6 Johnson counter that receives and counts the clock signal. When the counter 21 receives an adjust signal, which is a control signal, the count value of the counter is changed.

The frequency-divided clock signal (CTS CLK) is supplied to the CTS buffer 30. The CTS buffer 30 is placed automatically at the time of layout based upon the result of a delay simulation, etc.

The output clock signal of the PLL circuit 20 is supplied to a frequency divider circuit 110 that generates multiphase clock signals. The frequency divider circuit 110 outputs a frequency-divided multiphase clock signals whose phases are equally spaced apart. The multiphase clock signal from the frequency divider circuit 110 is supplied to a phase shift circuit (phase interpolator) 111.

Figure 3:
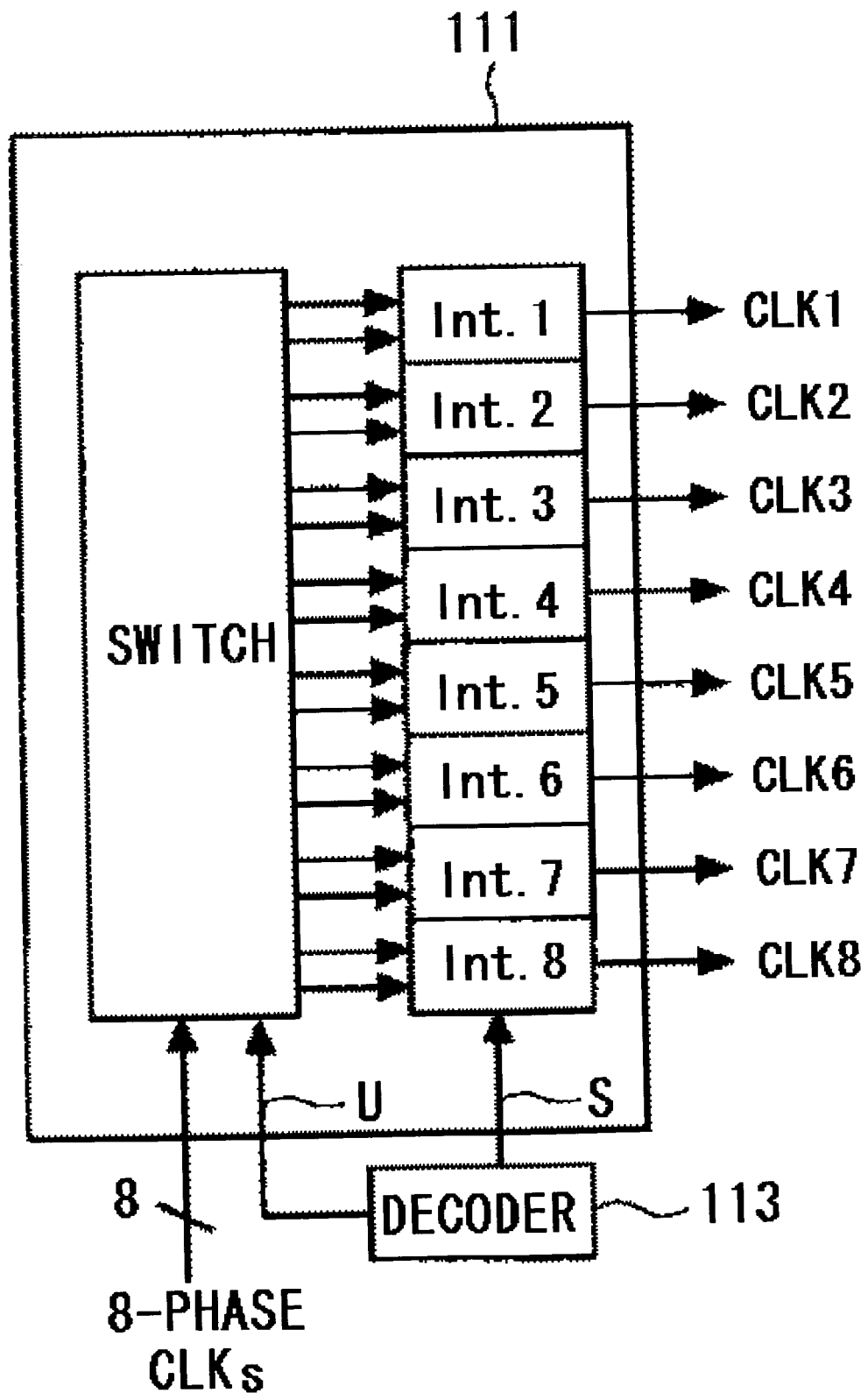
FIG. 3 is a diagram illustrating the structure of a phase shift circuit according to the present embodiment.

Based upon a control signal supplied from a CDR (Clock and Data Recover)) control circuit 113, the phase shift circuit (phase interpolator) 111 receives multiphase clock signals from the frequency divider circuit 110 and outputs multiphase clock signals, in which the phases of output clock signals correspond to phase differences obtained by internally dividing the phase differences of received clock signals. As shown for example in FIG. 3, the phase shift circuit 111 comprises a switch circuit and a plurality of interpolators (Int. 1 to Int. 8) connected in parallel with the switch circuit. The switch circuit receives the multiphase clock signals (eight phase clocks) as the input thereto and selects a signal pair that is output to each interpolator. Each interpolator produces an output signal of a phase obtained by internally dividing the phase difference between the two signals output from the switch circuit. A decoder in FIG. 3 corresponds to a decoder inside the CDR control circuit 113 of FIG. 2.

The output of the phase shift circuit (phase interpolator) 111 is supplied to a sampling circuit 112. The sampling circuit 112 includes a plurality of flip-flops (not shown) connected in parallel. A receiver 104 receives complimentary received signals RXT and RXC differentially and outputs an output signal differentially. The flip-flops of the sampling circuit 112 receive the output signals of the receiver 104 and latch the output signals responsive to the corresponding sampling clock signals from the phase shift circuit 111 for output.

The outputs of the flip-flops of the sampling circuit 112 are supplied to the CDR control circuit 113. The latter includes an up/down counter for counting up when a flip-flop output is logic "0" and counting down when the flip-flop output is logic "1"; a filter for time-averaging the output of the up/down counter; and a control circuit for decoding the output of the filter that is input thereto and supplying the phase shift circuit 111 with a signal (the internal dividing ratio of the phase interpolator) that controls phase. It should be noted that the clock and data recovery circuit is constructed by the frequency divider circuit 110, phase shift circuit 111, sampling circuit 112 and CDR control circuit 113. Furthermore, the arrangement set forth in Claim 4, for example, may be used as the clock and data recovery circuit, although this does not impose any particular limitation.

Among the receive data signals (four in the illustration) sampled by the plurality of flip-flops of the sampling circuit 112, two data signals that differ in phase by 180° owing to the multiphase clock signals are output as data signals (data signals of even- and odd-numbered bits) delivered from the clock and data recovery circuit.

In the present embodiment, the clock and data recovery circuit comprising the sampling circuit 112, phase shift circuit 111, frequency divider circuit 110 and CDR control circuit 113 has a receive-side demultiplexing function for generating the receive data and recovery clock signal, demultiplexing the received serial data from the receiver 104 at 1:2 and outputting the result as 2-bit parallel data. This circuit corresponds to a transmit-side multiplexer 137 that multiplexes the 2-bit parallel signal of FIG. 2 into serial data and outputs the data to a serial transmission line.

In the present embodiment, the 2-bit parallel data from the sampling circuit 112 of the clock and data recovery circuit is supplied to a serial-to-parallel converter circuit 116 via a selector 114. The serial-to-parallel converter circuit 116 of FIG. 2 corresponds to the serial-to-parallel converter circuit 12 of FIG. 1.

A clock for conversion supplied to the serial-to-parallel converter circuit 116 is a frequency-divided clock signal obtained by dividing the output of a selector 119 by 6 in a frequency divider circuit 117. The frequency divider circuit 117 corresponds to the frequency divider circuit 13 of FIG. 1. In the present embodiment, the frequency divider circuit 117 comprises, e.g., a Johnson counter, frequency-divides the recovery clock signal by 6 and generates multiphase clock signals whose phases are equally spaced apart.

In the case of the arrangement shown in FIG. 2, the selector 119 outputs the clock (the frequency-divided clock signal) of the PLL circuit 20 when a pass-through mode is in effect, and delivers the output clock signal of the phase shift circuit 111 when a retiming mode for adjusting timing is in effect. It should be noted that it is permissible to adopt an arrangement in which the selector 119 is eliminated and the output clock of the phase shift circuit 111 is supplied to the frequency divider circuit 117.

Figure 4:
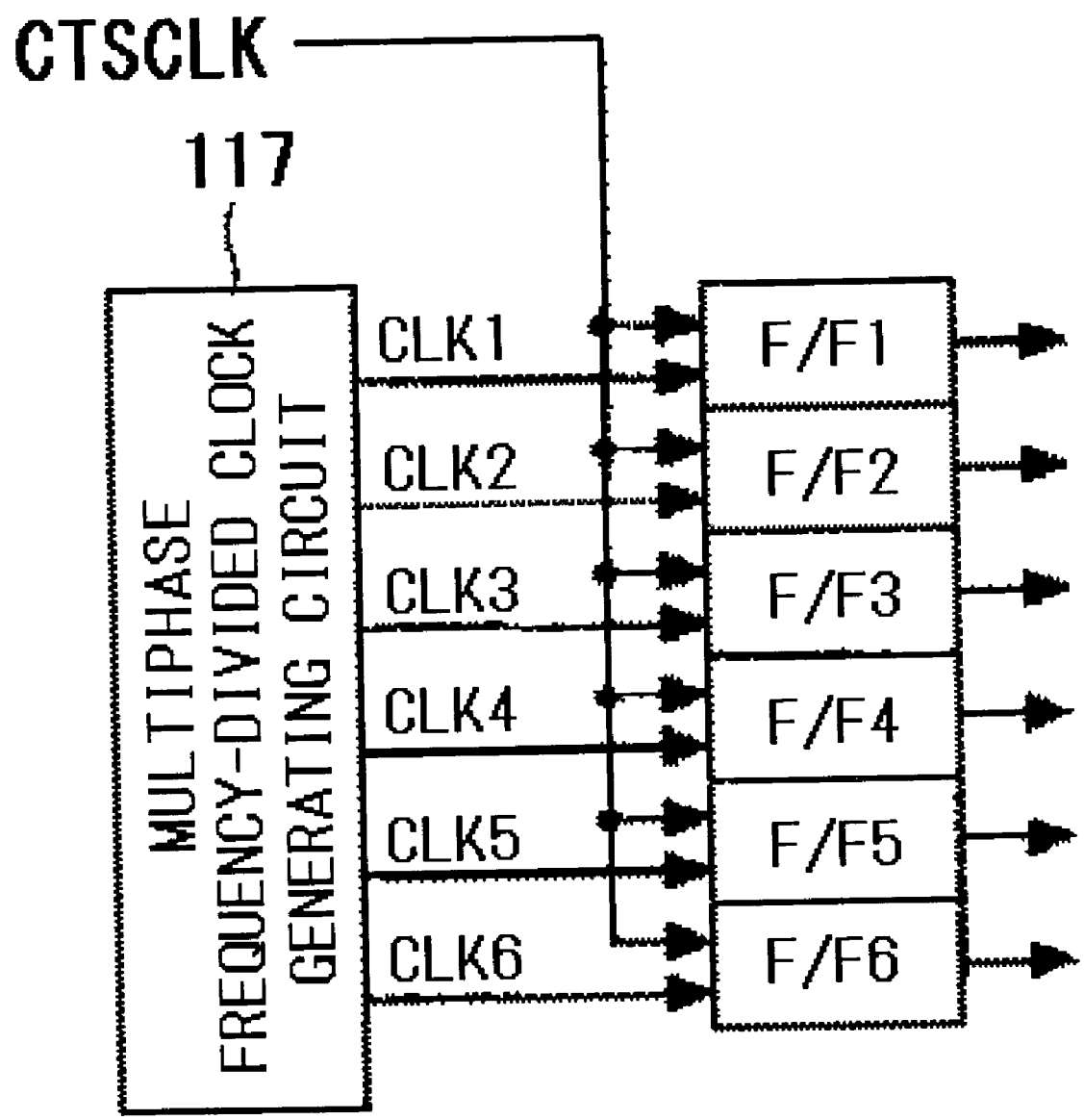
FIG. 4 is a diagram illustrating the structure of an edge detecting circuit according to the present embodiment.

An edge detector (EDGE DET) 118 has a plurality of flip-flops which receives the CTS clock signal (CTS CLK) from the CTS buffer 30 disposed inside the LSI in shared fashion. Frequency-divided clock signals of mutually different phases from the frequency divider circuit 117 are supplied to respective ones of the flip-flops. By sampling the CTS clock signal, the edge detector 118 detects the edge of the CTS clock signal. As shown for example in FIG. 4, the edge detector 118 comprises six flip-flips having data terminals which receive the CTS clock signal (CTS CLK) in common. Also input to the six flip-flops from the frequency divider circuit (multiphase frequency-divided clock generating circuit) 117 are respective ones of frequency-divided clocks CLK1, CLK2, . . . , and CLK6 whose phases are spaced apart from one another.

Figure 5:
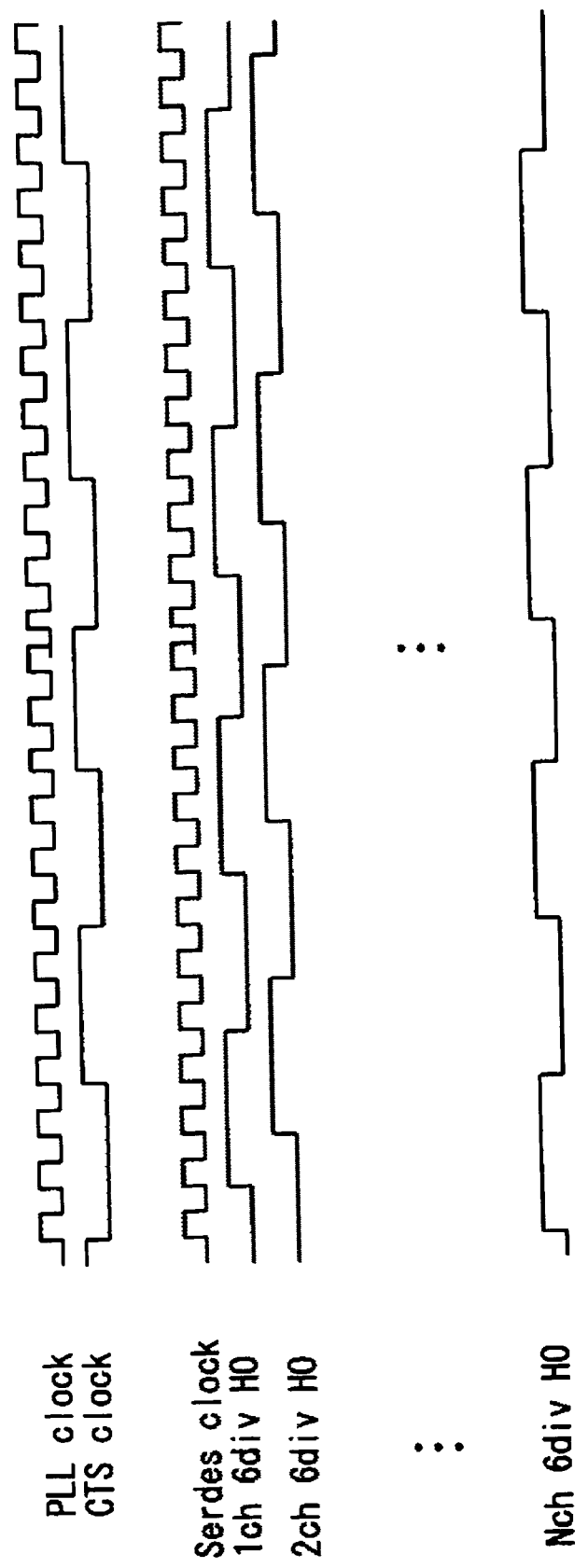
FIG. 5 is a timing chart useful in describing the operation of the present embodiment.

FIG. 5 illustrates the CTS clock signal (also referred to as an LSI core clock), which is obtained by dividing the output clock signal (PLL clock) of PLL circuit 20 by 6, and divided-by-6 clock signals (1*ch* 6*div* H0 to N*ch* 6*div* H0) of each recovery clock signal (Serdes clock) from channel 1 to channel N. In a case where the sample outputs of the six flip-flops are "001110" (Edge [5,0] information of FIG. 2), it is determined that the timing of the rising edge of the third-phase clock of frequency divider circuit 117 becomes closest to the rising edge of the CTS clock signal, and that the timing of the rising edge of the sixth-clock signal is closest to the falling edge of the CTS clock signal.

An edge detecting alignment circuit (Edge Detection 6Div align to CTS CLK) 120 uses the edge detection result Edge [5,0] to align the phase of the divided-by-6 clock of the recovery clock signal to the phase of the CTS clock signal (CTS CLK). For example, based upon the information that has been detected by the edge detector 118, the edge detecting alignment circuit 120 may use the frequency-divided clock of the rising edge that corresponds to the rising edge of the CTS clock signal as the divided-by-6 clock (6*div* H0) for the serial-to-parallel conversion. The edge detector 118 and edge detecting alignment circuit 120 construct the phase detection and alignment circuit 14 of FIG. 1.

Figure 6:
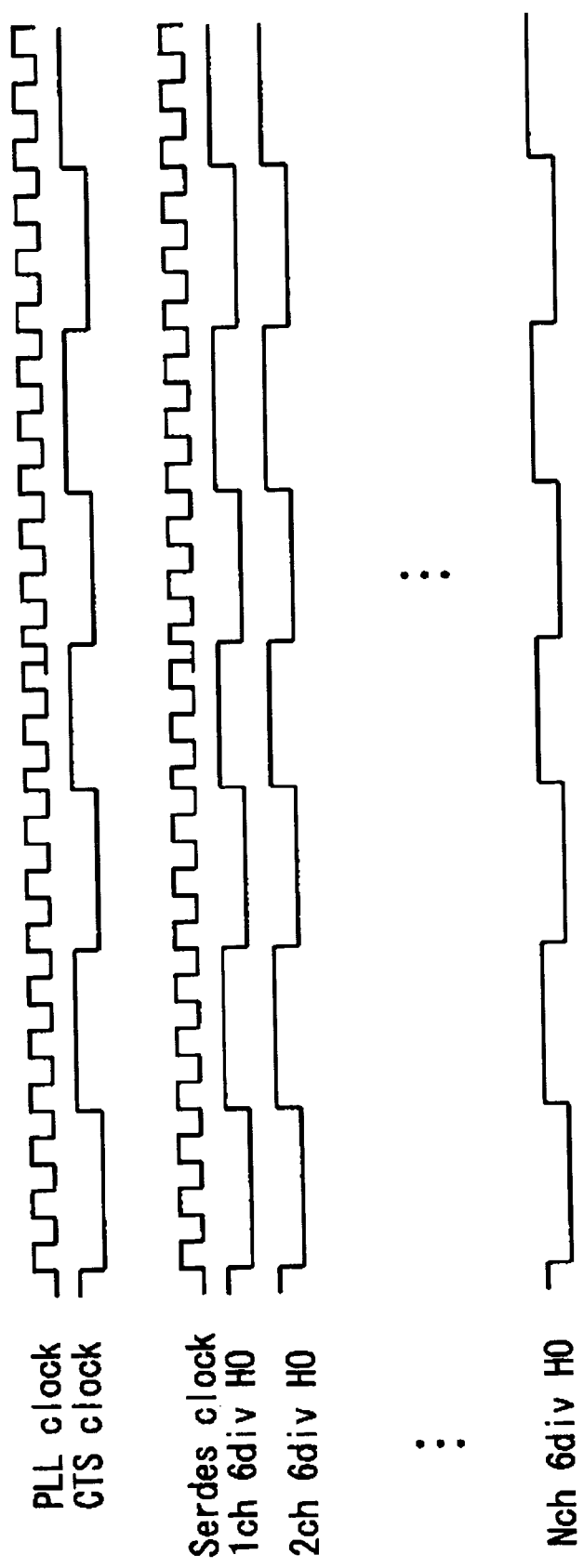
FIG. 6 is a timing chart useful in describing the operation of the present embodiment.

FIG. 6 illustrates the divided-by-6 clocks (1*ch* 6*div* H0 to N*ch* 6*div* H0) aligned to the CTS clock signal in the edge detecting alignment circuit 120 of FIG. 2. The PLL clock signal (PLL clock) is the output clock signal of the PLL circuit 20, and the CTS clock signal is the output clock signal from the CTS buffer 30. The Serdes clock is the recovery clock signal synchronized to the received serial data. The CTS clock signal and the Serdes clock are aligned at ±UI (unit interval), and the frequency-divided clock signal is aligned with the CTS clock signal.

The frequency-divided clock signal that has been aligned by the edge detecting alignment circuit 120 of FIG. 2 is supplied to an adjust signal generating circuit 121. The adjust signal generating circuit 121 supplies the frequency-divided clock as the transfer clock to a register array 122.

On each channel the parallel output (a total of 12 bits in which 6-bit ODD data and 6-bit EVEN data has been aligned in parallel) from the serial-to-parallel converter circuit 116 is output as RXDATA [11,0] and is written sequentially to the register array 122 (which corresponds to the register array 16 of FIG. 1).

In FIG. 2, the register array 122 (which corresponds to the register array 16 of FIG. 1) is constructed by connecting parallel flip-flops equivalent to sik bits in a cascade of four stages, although this does not impose a limitation upon the invention. The number of stages in the cascade connection naturally may be other than four. In FIG. 2, the register array 122 is illustrated only with regard to 6-bit even data for the sake of simplicity.

The 12-bit parallel data (RXDATA [11,0] from the serial-to-parallel converter circuit 116 and the total of the signals (12×4 bits) of each stage of the 12-bit output of the flip-flops of each of the stages of the register array 122 are supplied to a frame head detector 123 in parallel. The frame head detector 123, which corresponds to the frame-head detector 17 of FIG. 1, performs pattern matching between the frame-synchronized signal (e.g., 12 bits) and the input bit stream and detects the frame head. For a discussion of pattern detection, see Patent Reference 1 cited above. It should be noted that the 6-bit odd data and 6-bit even data may be compared separately. In the description that follows, instead of 12-bit data composed of six bits of even numbers and six bits of odd numbers, an example will be described in which detection of the frame head is performed by pattern matching with 6-bit data 0, 2, 4, 6, 8, 10 to simplify the description.

Figure 7:
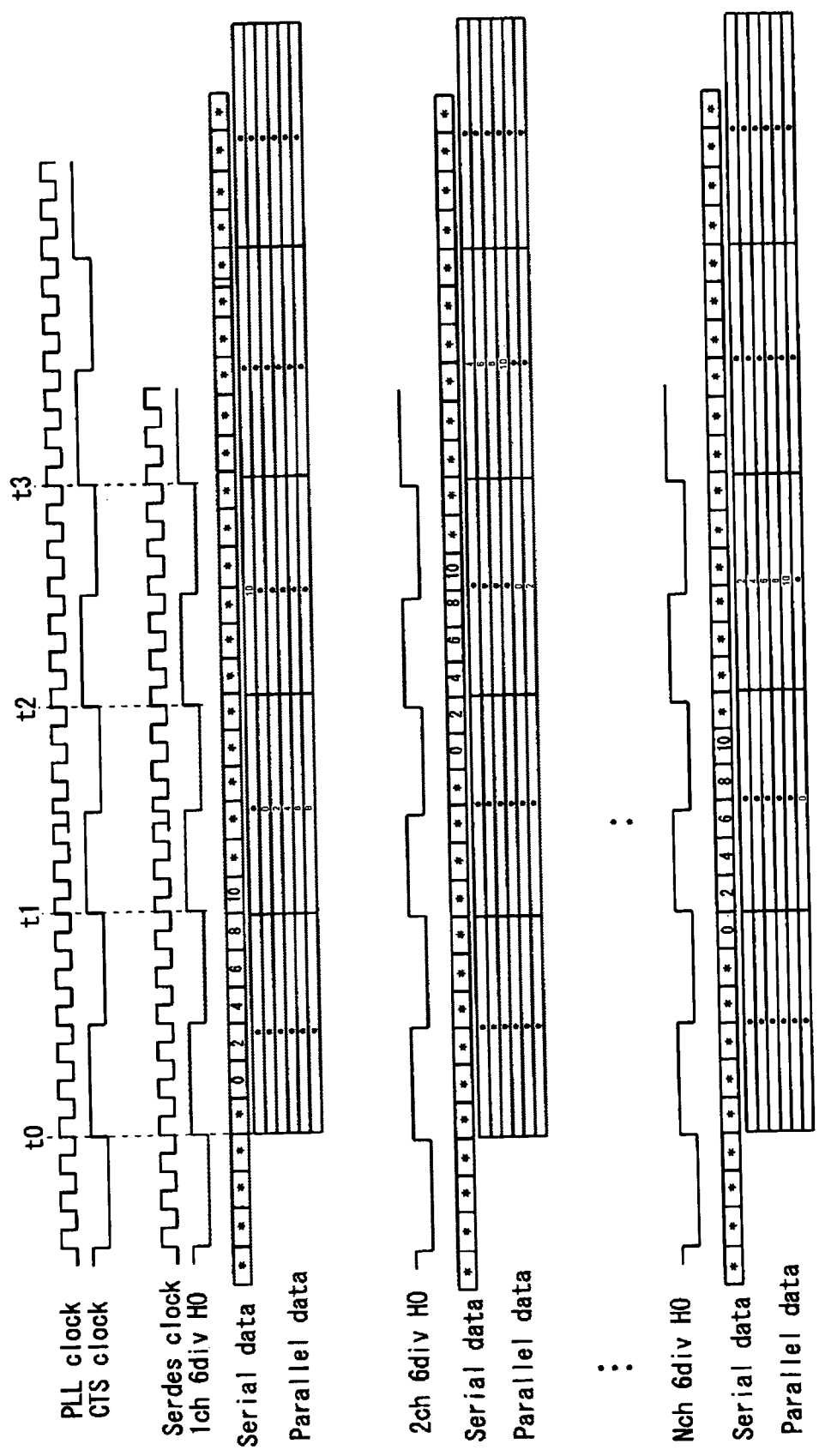
FIG. 7 is a timing chart useful in describing the operation of the present embodiment.

FIG. 7 is a timing diagram for describing the manner in which the frame head is detected. FIG. 7 illustrates the PLL clock signal (PLL clock), CTS clock signal, the Serdes clock signal, the received serial data (the even-numbered data corresponding to the rising edge) and the 6-bit parallel output from the serial-to-parallel converter circuit 116. The 6-bit parallel output from the serial-to-parallel converter circuit 116 is output in parallel in synchronization with the divided-by-6 clock of each channel. As shown in FIG. 7, the divided-by-6 clocks (1*ch* 6*div* H0 to N*ch* 6*div* H0) of each of the channels have been adjusted such that the phase is in conformity with the phase of the CTS clock signal, which is the core clock of the LSI.

The operation for detecting the frame pattern in the present embodiment will be described with reference to FIGS. 2 and 7. With regard to Channel 1 (1 ch), parallel data "*, 0, 2, 4, 6, 8" (where * represents even-numbered data prior to 0) is output from the serial-to-parallel converter circuit 116 and transferred to the first stage of the register array 122 at the rising edge of the divided-by-6 clock signal (1*ch* 6*div* H0: phase-synchronized to the CTS clock signal) at timing t1, and the succeeding parallel data "10, *, *, *, *, *" (where "*" represents even-numbered data that follows 10) is transferred to the register array 122 at the rising edge of the divided-by-6 clock signal at timing t2.

In response to receipt of the frequency-divided clock signal at timing t2, the frame head detector 123 detects the head pattern by pattern matching of "0, 2, 4, 6, 8, 10".

With regard to Channel 2 (2*ch*), parallel data "*, *, *, *, 0, 2" (where * represents even-numbered data prior to 0) is transferred to the register array 122 at the rising edge of the divided-by-6 clock signal (2*ch* 6*div* H0) at timing t2, and parallel data "4, 6, 8, 10, *, *" is output from the serial-to-parallel converter circuit 116 and transferred to the register array 122 at the rising edge of the frequency-divided signal at timing t3. In this example, the received serial data stream on Channel 2 (2ch) lags behind that on Channel 1 by nine clocks.

In response to receipt of the frequency-divided clock signal (2*ch* 6*div* H0) at timing t3, "4, 6, 8, 10, *, *" are output in parallel from the serial-to-parallel converter circuit 116. Based upon concatenation of "4, 6, 8, 10", which is part of the parallel data, and the data of "0, 1, 2" that has been output previously and stored in the register array 122, the frame pattern is detected by pattern matching of "0, 2, 4, 6, 8, 10" in the frame head detector 123 of Channel 2.

With regard to data on the Nth channel, parallel data "*, *, *, *, *, 0" is transferred to the register array 122 at the rising edge of the frequency-divided clock signal (Nch 6*div* H0) at timing t1, and parallel data "2, 4, 6, 8, 10, *" is transferred to the register array 122 at the rising edge of the frequency-divided signal at timing t2. In this example, the received serial data stream on Channel N lags behind that on Channel 1 by four clocks and leads that on Channel 2 by five clocks.

The frequency-divided clock signal (Nch 6*div* H0) at timing t2 is received and, based upon concatenation of "2, 4, 6, 8, 10", which is part of the parallel data, and the data of "0" that has been output previously and stored in the register array 122, the frame pattern is detected by pattern matching of "0, 2, 4, 6, 8, 10" in the frame head detector 123 of Channel N.

The frame detection signal that is output from the frame head detector 123 of each channel is supplied to the detecting circuit 40 that detects the channel on which the frame had is detected after the greatest delay.

The frame detection signals that are output from respective ones of the frame head detectors 123 on the 1st to Nth channels are supplied to the detecting circuit 40, which discriminates the channel on which the frame detection signal was output after the greatest delay and detects the delay.

In the case of FIG. 7, Channel 2 (2 ch) corresponds to the channel on which the frame detection signal was output after the greatest delay. The received serial data stream on Channel 2 lags behind the received serial data stream on Channel 1 by nine clock cycles and behind the received serial data stream on Channel N by five clock cycles.

The timing controller 50 makes the divided-by-6 clock signal (6*div* H0, etc.) on each channel and the CTS clock signal conform to the timing of the frame head on the channel having the greatest delay. More specifically, the timing controller 50 supplies the control signal for timing adjustment to the adjust signal generating circuit 121 (which corresponds to the adjust-signal generating circuit 15 of FIG. 1) on each channel.

The adjust signal generating circuit 121 generates the control signal (Adjust) for advancing the divided-by-6 clock signal in the frequency divider circuit 117. The timing controller 50 outputs the signal (Adjust CTS), which is for advancing the CTS control signal, to the frequency divider circuit 21.

Timing is adjusted on each channel using as a reference the output timing of the frame head detected last. On Channel 2, for example, the divided-by-6 clock is adjusted by two clock cycles in the frequency divider circuit 117 based upon the control signal Adjust. In this case, the frequency divider circuit 117 receives the control signal Adjust, counts at the count period 4 for only one cycle and then returns to count period 6. As a result, start time of the frame head on Channel 2 in FIG. 7 and timing of the rising edge of the frequency-divided clock signal (2*ch* div H0) coincide. The frequency-divided clock signal is similarly adjusted by two clocks in the frequency divider circuits 117 on the other channels.

Figure 8:
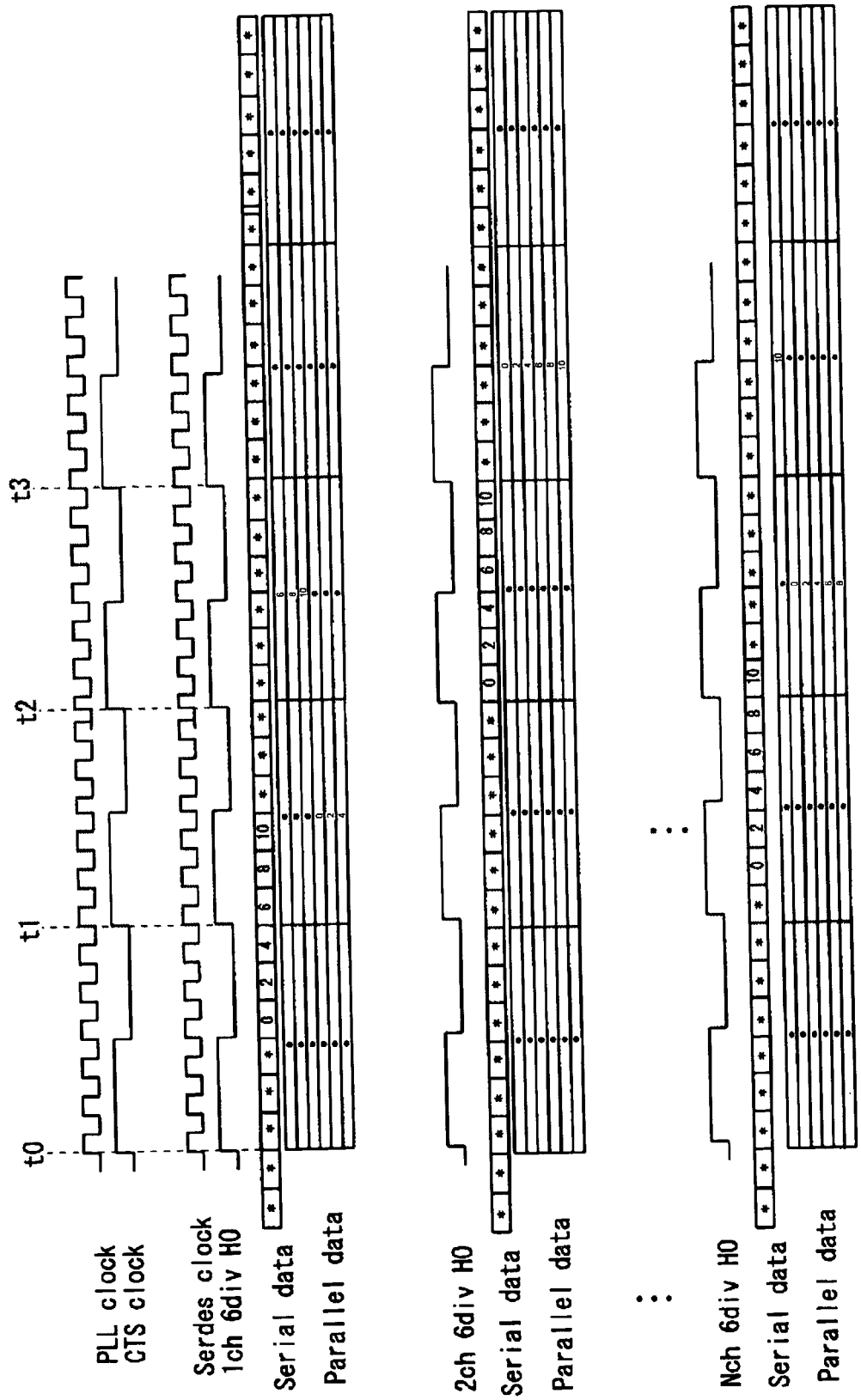
FIG. 8 is a timing chart useful in describing the operation of the present embodiment.

FIG. 8 illustrates received serial data as well as parallel data, which is output from a serial-to-parallel converter circuit, on channels 1, 2, . . . , N in a case where the frequency-divided clock signal and CTS clock signal have been made to conform to the detection timing of the last frame pattern (frame head). On Channel 2, the parallel data output from the serial-to-parallel converter circuit 116 at timing t3 is 6-bit data of 0, 2, 4, 6, 8, and 10, and the parallel output has been aligned to the frame head. From this point onward, the parallel data output that is output based upon the divided-by-6 clock signal is frame-synchronized.

A selector 125 corresponds to the selector 18 of FIG. 1. In order to byte- or word-align and output the output parallel data from other channels in conformity with the detection timing of the frame pattern on the channel on which the frame pattern was detected last, the selector 125 selects extraction of data on the node of the register array 122. The selector 125 may be constructed as an integral part of the frame head detector 123 (because the parallel data groups that are input are the same).

All parallel data that has been output from the serial-to-parallel converter circuit 116 on a particular channel is stored in the register array 122 of each channel until the frame pattern is detected on the last channel following detection of the frame pattern on this particular channel. The number of stages of the register array 122 is set taking into consideration the maximum delay, etc., of a frame between channels.

Figure 9:
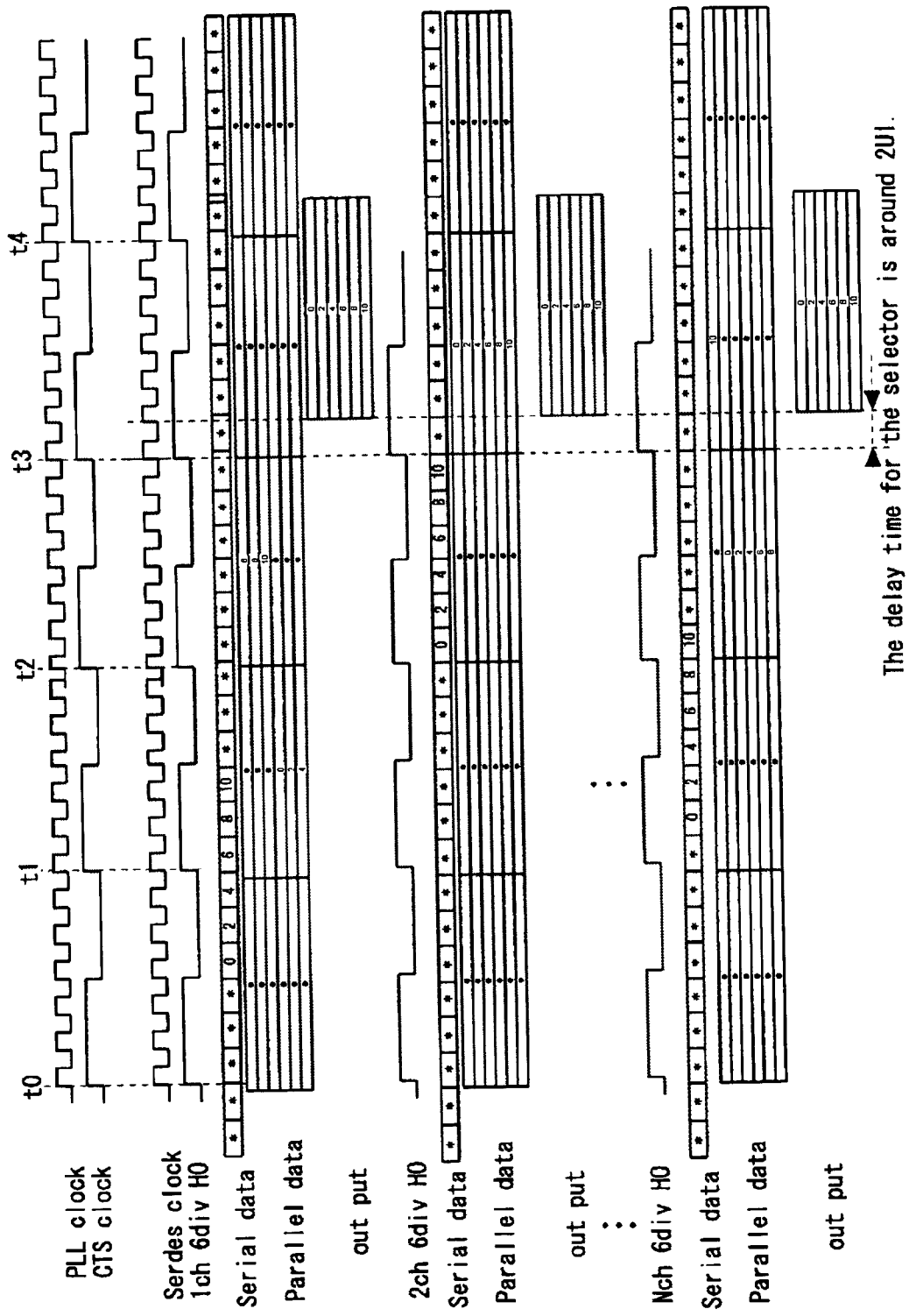
FIG. 9 is a timing chart useful in describing the operation of the present embodiment.
Figure 10:
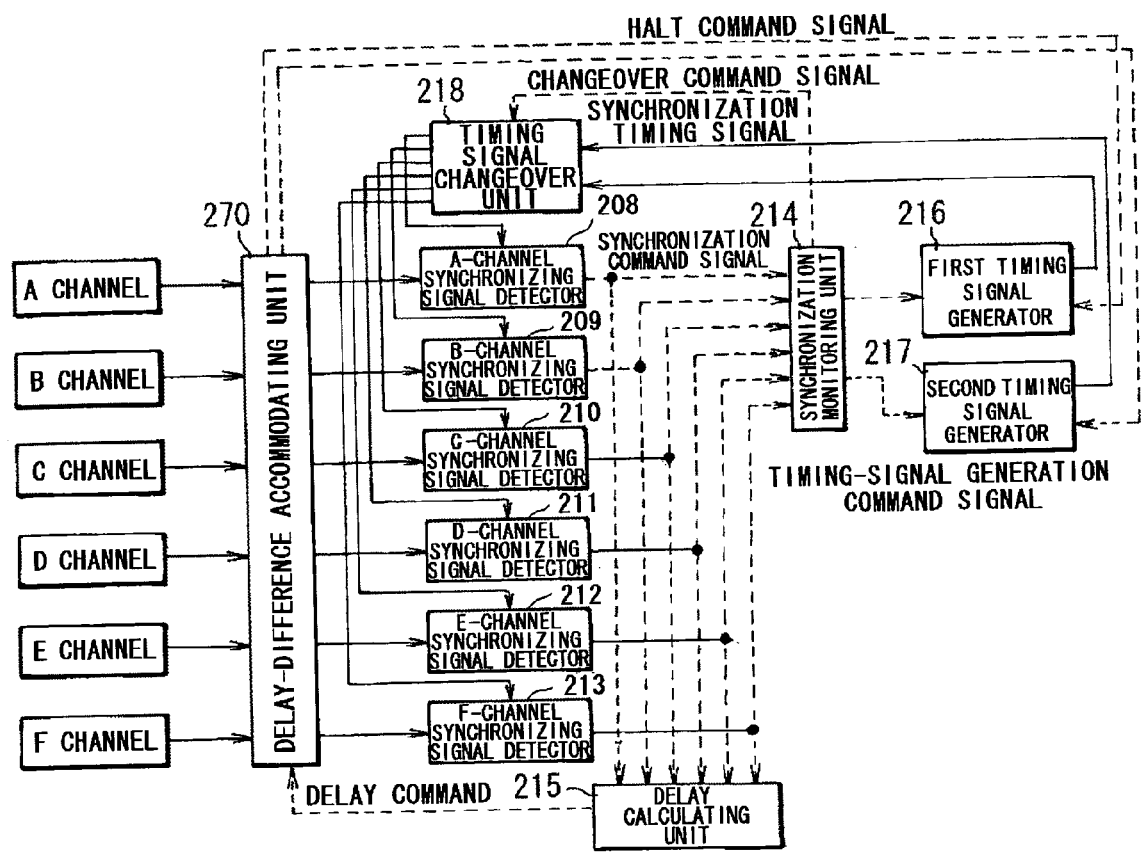
FIG. 10 is a diagram illustrating a channel synchronizing circuit according to the present invention.
Figure 11:
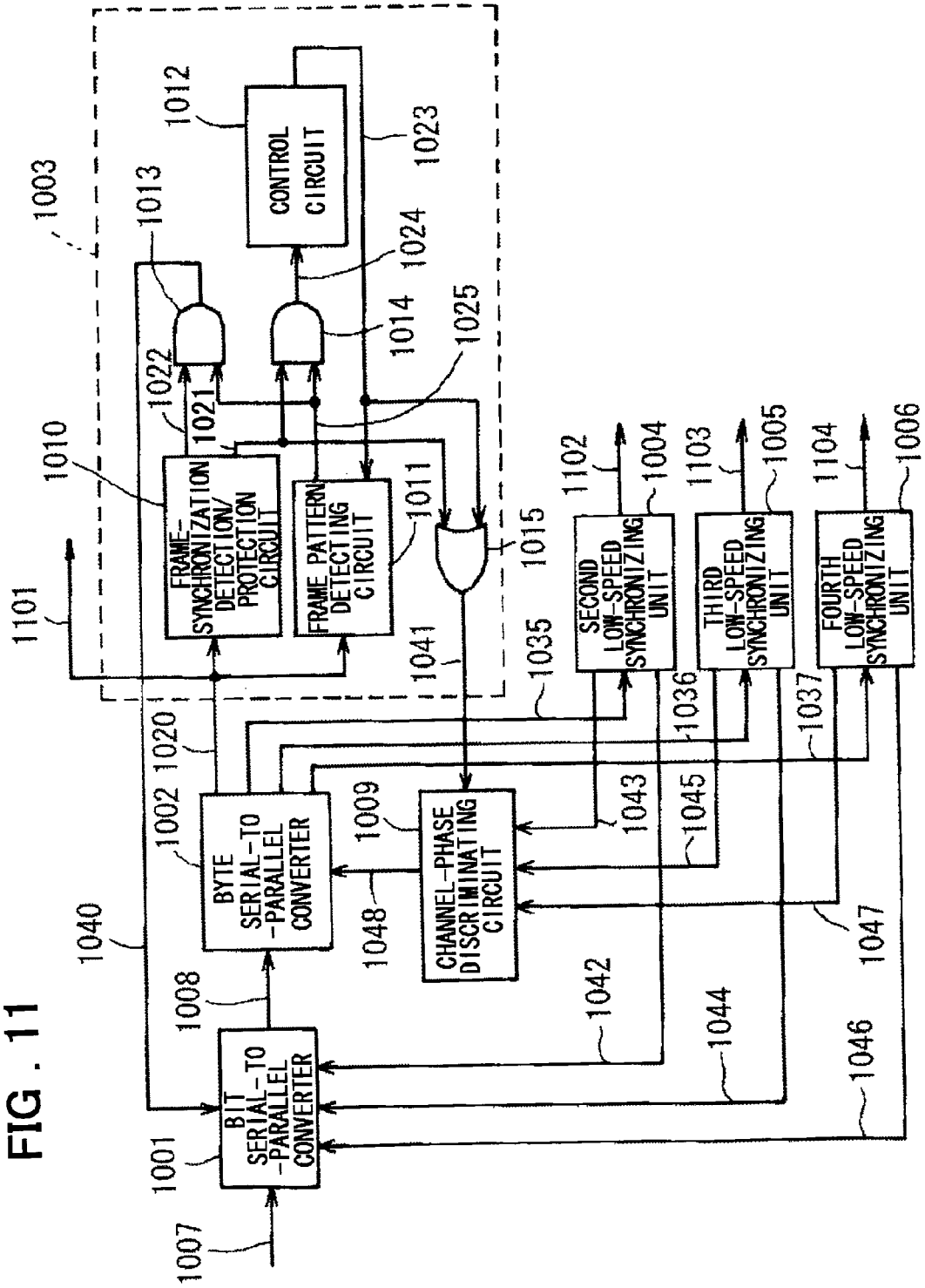
FIG. 11 is a diagram illustrating a frame synchronizing circuit according to the prior art.

As shown in FIG. 9, the 6-bit data of the frame head on Channel 2 is synchronized correctly (timings t2 to t3) to one clock period of the frequency-divided clock signal (2*ch* 6*div* H0) in a state in which the timing of the frequency-divided clock signal has been made to agree with the detection timing of the last frame pattern. Accordingly, the serial 6-bit data on Channel 2 is output in parallel from the serial-to-parallel converter circuit 116, and the 6-bit parallel signal of the preceding stage transferred to the register array 122 is selected and output by the selector 125 on Channel 2.

On the other hand, the serial 6-bit data on Channel 1 is output in parallel from the serial-to-parallel converter circuit 116 on channel 1 and is written to the register array 122 on channel 1. The selector 125 on Channel 1 selects 3-bit data from the third to sixth rows from the top of the second stage from the input side of the register array 122 and 3-bit data from the first to the third rows from the top of the first stage from the input side, concatenates the data to six bits and outputs the data in parallel. That is, at the moment the frame pattern on Channel 2 is output in parallel from the serial-to-parallel converter circuit 116, the selector 125 of Channel 1 also byte- or word-aligns and outputs the frame pattern on Channel 1 in parallel.

Similarly, the serial 6-bit data on Channel N is output in parallel from the serial-to-parallel converter circuit 116 on channel N and is written to the register array 122 on channel 1. The selector 125 on Channel 1 selects 5-bit data from the second to sixth rows from the top of the first stage from the input side of the register array 122 and 1-bit data of the node of the first row from the input side, concatenates the data to six bits and outputs the data in parallel. That is, at the moment the frame pattern on Channel 2 is output in parallel, the selector 125 of Channel 1 also byte- or word-aligns and outputs the frame pattern on Channel N in parallel. Similarly, from this point onward, frame synchronization is performed and the frame pattern is byte- or word-aligned and output from each channel.

In the present embodiment, the delay of the selector 125 is 2 UI. In accordance with the present embodiment, the register array 122 does not require a read-out clock (a counter circuit for generating a read-out address), unlike a FIFO. Thus, in accordance with the present invention, latency is reduced significantly, unlike the case with a FIFO (in which the delay is 12 to 24 UI, as mentioned above). This arrangement is one characterizing feature of the present invention.

In FIG. 2, a node selector 126 for deskewing receives the frame detection signal from the frame head detector 123, the output of the last-frame-head detector 40 (the frame-head detection timing information on the channel on which the frame head was detected last) and the frequency-divided clock signal for the serial-to-parallel (SP) conversion, and supplies a phase selection signal generating circuit 130 with a signal for varying and controlling the latch-timing phase of the latch circuit in the transmitter circuit and the frame-enable timing phase. This is for controlling skew adjustment in the receiver circuits $10_1$ to $10_N$ when the parallel data from the transmitter circuit side is converted to serial data and output to the serial transmission line after channel-to-channel skew has been adjusted. The node selector 126 selects a node in a skew adjusting circuit 131. The latter selects an input signal from the selector at the node at which the frame-enable signal (FRenable) has been specified by the node selector 126, and a flip-flop output is selected at a selector of a succeeding stage. As a result, the timing (delay) of the frame-enable signal (FRenable) is controlled. Further, the node selector 126 for deskewing controls the phase selection signal generating circuit 130, which outputs a signal LTphase that controls the timing phase of the latch in the transmitter circuit and a signal FRphase that controls frame phase. When the signal LTphase is in the activated state, the frequency-divided clock from the frequency divider circuit 117 is latched by a latch circuit 132 via a circuit 134 and is supplied to a selector 136 as the signal FRenable. When the signal FRenable is in the activated state, the selector 136 outputs 2-bit data from a 12:2 parallel-serial converting circuit 133 to a multiplexer 137. The latter converts the two bits to 1-bit serial data. The 1-bit serial data obtained by the conversion is output from transmit data terminals TXT, TXC in differential form via a pre-emphasis circuit (a circuit for emphasizing the amplitude of an output signal when the logic value of the signal change to improve the waveform on the receiving side) 138 and differential-output driver 139.

Although it does not have a direct bearing upon the present invention, a reference voltage circuit 103 supplies a reference voltage to a receiver 104 and driver 139, each of which comprises a differential circuit. Further, when the pass-through mode is in effect, the selector 114 outputs data, which is synchronized with the PLL clock signal by the FIFO circuit 115, to the multiplexer circuit 137 through selector 136. An even/odd check circuit 124 performs an even/odd check. The CDR control circuit 113 exercises control in such a manner that even-numbered data is sampled at the rising edge of the clock and odd-numbered data at the falling edge of the clock. A signal LOCKPLL from the PLL circuit 20 is a signal indicating that the PLL is in the locked state.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications from the disclosed embodiments may be done without departing the scope of the present invention claimed as appended herewith.

Also it should be noted that any combination of the disclosed and/or claimed elements, matters and/or items may fall under the modifications aforementioned.

What is claimed is:

1. A synchronization device comprising a plurality of receiver circuits on a plurality of channels, each receiver circuit receiving input serial data on an associated channel, subjecting the received serial data to a serial-to-parallel conversion, and outputting parallel data,
    wherein said receiver circuit on each of the plurality of channels includes:
        a circuit for bringing a phase of a clock signal used at least in the serial-to-parallel conversion into conformity with a phase of an internal clock signal, said internal clock signal is supplied to said receiver circuit and adjusted for skew at a clock input terminal of said receiver circuit on each of the plurality of channels, to attain synchronization among the plurality of channels;
        a clock-and-data recovery circuit for generating a data signal and a recovery clock signal from received serial data and a serial-to-parallel converter circuit for subjecting the data signal output from said clock-and-data recovery circuit to a serial-to-parallel conversion based upon a frequency-divided clock signal obtained by frequency-dividing the recovery clock signal; and
        a register array for holding the parallel data signal, which has been obtained by a conversion in said serial-to-parallel converter circuit, from a moment of detection of a frame pattern in said receiver circuit to a moment of detection of a frame pattern on a channel on which the frame pattern was detected last, and byte-aligned or word-aligned parallel data signals are output in unison from said receiver circuits on the plurality of channels in synchronization with a timing at which the frame pattern was detected on the channel on which the frame pattern was detected last.

2. The synchronization device according to claim 1, wherein said receiver circuit performs control to bring a phase of the frequency-divided clock signal used at least in the serial-to-parallel conversion into conformity with the phase of the internal clock signal supplied to said receiver circuit and adjusted for skew at a clock input terminal of said receiver circuit on each of the plurality of channels, thereby assuring synchronization among the plurality of channels.

3. The synchronization device according to claim 2, further comprising a circuit for performing control for bringing a timing phase of the frequency-divided clock signal in said receiver circuit of each channel into conformity with a timing phase of the internal clock signal using, as a reference, a detection timing of the frame pattern on the channel on which a frame pattern was detected last.

4. The synchronization device according to claim 1, wherein said frame pattern comprises a comma code for byte or word alignment used in a high-speed interface.

5. A synchronization device for receiving data on a plurality of channels and performing channel-to-channel synchronization and frame synchronization, comprising the following on each of the plurality of channels:
a clock and data recovery circuit, which receives multiphase clock signals generated from a clock signal that is output from a clock source within the device, and a received data signal of the channel, for generating a data signal and a recovery clock signal;
a first frequency divider circuit, which receives the recovery clock signal, for generating a frequency-divided clock signal from this clock signal;
a phase detection control circuit for detecting a phase difference between a phase of the frequency-divided clock signal from said first frequency divider circuit and a phase of an internal clock signal supplied within the device and adjusted for skew, the clock signal is obtained by frequency dividing the clock signal from the clock source, and exercising control in such a manner that the phase of the frequency-divided clock signal and the phase of the internal clock signal will substantially coincide;
a serial-to-parallel converter circuit, which receives the frequency-divided clock signal from said first frequency dividing circuit, for converting the data signal, which is output from said clock and data recovery circuit, to parallel data;
a register array for holding the parallel data, which is output from said serial-to-parallel converter circuit, for a prescribed number of stages; and
a frame detecting circuit for detecting a frame pattern from output signals of said serial-to-parallel converter circuit or from said serial-to-parallel converter circuit and said register array, and outputting a frame detection signal,
wherein said synchronization device further comprises the following shared by the plurality of channels:
a detecting circuit, which receives the frame detection signal from said frame detecting circuit of each channel, for detecting, from among the plurality of channels, a channel on which a frame pattern was detected last; and
a timing control circuit for exercising control in such a manner that a timing of a frame head of a channel on which the frame pattern was detected last, the phase of the internal clock signal and the phase of the frequency-divided dock signal in the receiver circuits of the respective channels are shifted and adjusted so as to substantially coincide,
wherein until the frame pattern is output in parallel from said serial-to-parallel converter circuit on the channel in which the frame pattern was detected last, parallel data signals that have been output from said serial-to-parallel converter circuits of the other channels are held in the register arrays of these other channels, and
wherein in the receiver circuits of the respective channels, frame-synchronized parallel data signals are output in unison using as a reference the detection timing of the frame pattern of the channel on which the frame pattern was detected last.

6. The synchronization device according to claim 5, further comprising a second frequency divider circuit for frequency dividing the clock signal from the clock source within the device,
wherein the internal clock signal supplied to the receiver circuit of each channel comprises a Clock Tree Synthesis (CTS) clock signal adjusted for skew between clocks via CTS buffers mounted on the same chip as said receiver circuit, for propagating the frequency-divided clock signal from said second frequency divider circuit.

7. The synchronization device according to claim 5, wherein said synchronization device performs control to bring the timing phase of the frequency-divided clock signal of said first frequency divider circuit of the channel on which the frame pattern was detected last into conformity with the detection timing of the frame pattern on the channel in which the frame pattern was detected last, and to bring the timing phases of the frequency-divided clocks of said first frequency-divider circuits on the other channels and the timing phase of the internal clock signal into conformity with the detection timing of the frame pattern on the channel on which the frame pattern was detected last.

8. The synchronization device according to claim 5, wherein said first frequency divider circuit comprises a counter, receiving the recovery clock signal as an input clock,
wherein said counter is configured to variably set a counting period thereof temporarily under control from said timing control circuit to output a byte-aligned or word-aligned parallel data signal from said serial-to-parallel converter circuit in synchronization with the detection timing of the frame pattern on the channel on which the frame pattern was detected last.

9. The synchronization device according to claim 6, wherein said second frequency divider circuit comprises a counter, and
wherein said counter is configured to set a counting period thereof variably and temporarily in terms of time under control from said timing control circuit to output a byte-aligned or word-aligned parallel data signal from said serial-to-parallel converter circuit in synchronization with the detection timing of the frame pattern on the channel on which the frame pattern was detected last.

10. The synchronization device according to claim 6, wherein said first frequency divider circuit generates multiphase frequency-divided clock signals of phases that are spaced apart from one another, said synchronization device further comprising, on each of the plurality of channels an edge detecting circuit to receive the CTS clock signal and multiphase frequency-divided clock signals, for detecting a transition edge of the CTS clock signal using the multiphase frequency-divided clock signals,
wherein the phase of the frequency-divided clock signal used in the serial-to-parallel conversion is adjusted to best coincide with the phase of the CTS clock signal.

11. The synchronization device according to claim 5, further comprising, on each of the plurality of channels, a selector for outputting a byte- or word-aligned parallel data signal in synchronization with the detection timing of the frame pattern on the channel on which the frame pattern was detected last,
wherein said parallel data signal is output from said parallel-serial converting circuit on the channel on which the frame pattern was detected last, and is output from said register array on channels other than the channel on which the frame pattern was detected last.

12. The synchronization device according to claim 5, wherein said synchronization device further comprises transmitter circuits on a plurality of channels,
   wherein each transmitter circuit includes a parallel-serial converting circuit for converting parallel data to transmit serial data using the frequency-divided clock signal whose phase has been adjusted to the phase of the internal clock signal, and
   wherein an output signal from said parallel-serial converting circuit is output to a serial transmission line.

13. The synchronization device according to claim 12, wherein said synchronization device further comprises a circuit for adjusting timing of the transmit serial data based upon a frame detection signal of the channel of said circuit and timing information indicative of detection timing of the frame pattern on the channel on which the frame pattern was detected last.

14. A semiconductor device, comprising a plurality of receiver circuits on a plurality of channels, each receiver circuit receiving input serial data on an associated channel and subjecting the received serial data to a serial-to-parallel conversion to convert the serial data to a parallel data signal,
   wherein said receiver circuit on each of the plurality of channels includes:
      a circuit to bring a phase of a clock signal used at least in the serial-to-parallel conversion into conformity with a phase of a CTS clock signal supplied to said receiver circuit on each channel and adjusted for skew at clock input terminals of said plurality of receiver circuits via CTS buffers disposed within said semiconductor device to synchronize the plurality of channels;
      a clock-and-data recovery circuit for generating a data signal and a recovery clock signal from received serial data; and
      a serial-to-parallel converter circuit for subjecting the data signal, output from said clock-and-data recovery circuit, to a serial-to-parallel conversion based upon a frequency-divided clock signal obtained by frequency-dividing the recovery clock signal,
   wherein said receiver circuit detects a frame pattern that has been inserted into the input serial data and outputs a parallel data signal synchronized to the frame pattern, and
   wherein said receiver circuit performs control to bring the phase of the clock signal used at least in the serial-to-parallel conversion into conformity with the phase of the CTS clock signal which is supplied to said receiver circuit on each channel and adjusted for skew at clock input terminals of said plurality of receiver circuits via CTS buffers disposed within said semiconductor device to assure synchronization among the plurality of channels using, as a reference, detection timing of a frame pattern on a channel on which a frame pattern was detected last.

15. The semiconductor device according to claim 14, wherein said receiver circuit on each channel includes a register array for holding the received data from a moment of detection of a frame pattern in said receiver circuit to a moment of detection of a frame pattern on a channel on which the frame pattern was detected last, and
   wherein byte-aligned or word-aligned parallel signals are output in unison from said plurality of receiver circuits in synchronization with a timing at which the frame pattern was detected on the channel on which the frame pattern was detected last.

16. The semiconductor device according to claim 14, wherein said receiver circuit on each channel comprises a frequency divider circuit for generating the frequency-divided clock signal in said receiver circuit on each channel, said frequency divider circuit comprising a counter which receives the recovery clock signal as an input,
   wherein said counter is configured to variably set a counting period thereof temporarily that a byte-aligned or word-aligned parallel data signal is output from said serial-to-parallel converter circuit in synchronization with the detection timing of the frame pattern on the channel on which the frame pattern was detected last.

17. The semiconductor device according to claim 14, further comprising a frequency divider circuit for generating the CTS clock by frequency-dividing a clock signal from a Phase-Locked Loop (PLL) circuit constituting a clock source,
   wherein said frequency divider circuit comprises a counter configured to variably set a counting period thereof temporarily, to output a byte-aligned or word-aligned parallel data signal from said serial-to-parallel converter circuit in synchronization with the detection timing of the frame pattern on the channel on which the frame pattern was detected last.

18. The semiconductor device according to claim 14, wherein said receiver circuit on each channel further comprises:
   a frequency divider circuit for generating the frequency-divided clock signal in said receiver circuit on each channel, said frequency divider circuit generating multiphase frequency-divided clock signals of phases that are spaced apart from one another; and
   an edge detecting circuit, which receives the CTS clock signal and multiphase frequency-divided clock signals, for detecting a transition edge of the CTS clock signal using the multiphase frequency-divided clock signals,
   wherein the phase of the frequency-divided clock signal used in the serial-to-parallel conversion is adjusted to best coincide with the phase of the CTS clock signal.

19. The semiconductor device according to claim 14, wherein said receiver circuit on each channel further comprises a selector for outputting a byte-aligned or word-aligned parallel data signal in synchronization with the detection timing of the frame pattern on the channel on which the frame pattern was detected last,
   wherein said parallel data signal is output from said parallel-serial converting circuit on the channel on which the frame pattern was detected last, and is output from said register array on channels other than the channel on which the frame pattern was detected last.

20. The semiconductor device according to claim 14, further comprising a circuit for adjusting timing of the transmit serial data based upon a frame detection signal of the channel of said circuit and timing information indicative of detection timing of the frame pattern on the channel on which the frame pattern was detected last.

* * * * *